United States Patent [19]

Rodder

[11] Patent Number: 5,629,218
[45] Date of Patent: May 13, 1997

[54] METHOD FOR FORMING A FIELD-EFFECT TRANSISTOR INCLUDING A MASK BODY AND SOURCE/DRAIN CONTACTS

[75] Inventor: Mark S. Rodder, Dallas, Tex.

[73] Assignee: Texas Instruments Incorporated, Dallas, Tex.

[21] Appl. No.: 278,681

[22] Filed: Jul. 21, 1994

Related U.S. Application Data

[60] Continuation of Ser. No. 36,587, Mar. 24, 1993, abandoned, which is a division of Ser. No. 788,973, Nov. 7, 1991, Pat. No. 5,231,296, which is a continuation of Ser. No. 618,015, Nov. 26, 1990, abandoned, which is a continuation of Ser. No. 452,854, Dec. 19, 1989, abandoned.

[51] Int. Cl.$^6$ ............................................. H01L 21/265
[52] U.S. Cl. ..................................... 438/158; 438/586
[58] Field of Search ............................ 437/41, 101, 40, 437/21, 62, 29, 40 TFI, 40 TFT, 41 TFI, 41 TFT; 257/66, 67, 69, 70, 75, 347, 348, 349, 350, 352, 353, 354

[56] References Cited

U.S. PATENT DOCUMENTS

| | | | |
|---|---|---|---|
| 3,514,676 | 5/1970 | Fa . | |
| 4,396,930 | 8/1983 | Mizutani | 357/23 |
| 4,465,528 | 8/1984 | Goto | 148/187 |
| 4,619,034 | 10/1986 | Janning | 29/571 |
| 4,624,737 | 11/1986 | Shimbo | 257/353 |
| 4,800,177 | 1/1989 | Nakamae | 437/193 |
| 4,814,292 | 3/1989 | Sasaki et al. | 437/101 |
| 4,898,841 | 2/1990 | Ho | 437/200 |
| 4,966,868 | 10/1990 | Murali et al. | 437/193 |
| 4,980,308 | 12/1990 | Hayashi et al. | 437/62 |
| 4,992,152 | 2/1991 | Mehra et al. | 204/192.15 |
| 4,992,391 | 2/1991 | Wang | 437/43 |
| 4,998,150 | 3/1991 | Rodder et al. | 357/34.1 |
| 5,047,360 | 9/1991 | Nicholas | 437/40 |
| 5,070,038 | 12/1991 | Jin | 437/200 |
| 5,084,413 | 1/1992 | Fujita et al. | 437/189 |
| 5,111,260 | 5/1992 | Malhi et al. | 257/347 |
| 5,116,780 | 5/1992 | Samata et al. | 437/89 |
| 5,124,276 | 6/1992 | Samata et al. | 437/89 |
| 5,173,753 | 12/1992 | Wu | 257/347 |
| 5,231,296 | 7/1993 | Rodder | 257/66 |

FOREIGN PATENT DOCUMENTS 59-14677  1/1984  Japan .

OTHER PUBLICATIONS

Wolf, S. and R. Tauber, "Silicon Processing for the VLSI ERA", Lattice Press, Sunset Beach, CA. 1986.
Haisma et al., "Silicon–on–Insulator Wafer Bonding–Wafer Thinning Technological Evaluations" Japanese Journal Appl. Phys., vol. 28, No. 8, 1989, pp. 1426–1443.
W. T. Lynch, "Self–Aligned Contact Schemes for Source– –Drains in Submicron Devices", *IEDM* 87, pp. 354–357.

*Primary Examiner*—John Niebling
*Assistant Examiner*—Brian K. Dutton
*Attorney, Agent, or Firm*—Ira S. Matsil; Wade James Brady, III; Richard L. Donaldson

[57] ABSTRACT

A thin film transistor and method for forming the same are disclosed. The transistor comprises a gate conductor (14) and a gate insulator (16). A semiconductor channel layer (18) is formed adjacent the gate insulator (16). A mask block (22) is formed covering a channel region (30) in the channel layer (18). A source region (26) and a drain region (28) are formed in the channel layer (18) adjacent opposite ends of the mask block (22). Conductive bodies (32) and (34) are formed in contact with source region (26) and drain region (28), respectively. Electric contacts (42) and (44) are then formed in contact with conductive bodies (32) and (34), respectively.

35 Claims, 1 Drawing Sheet

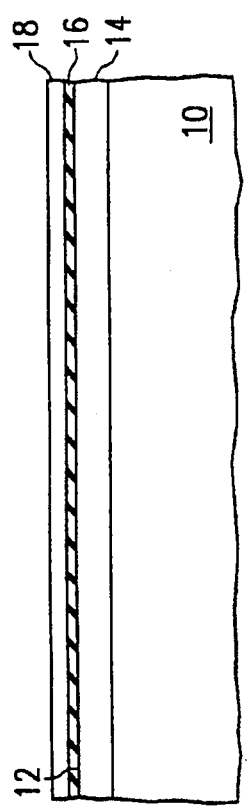
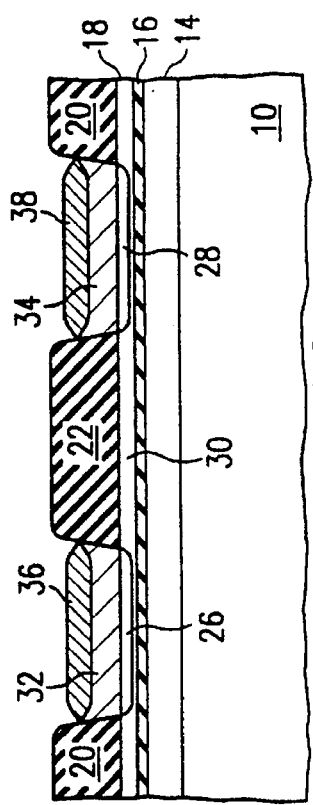
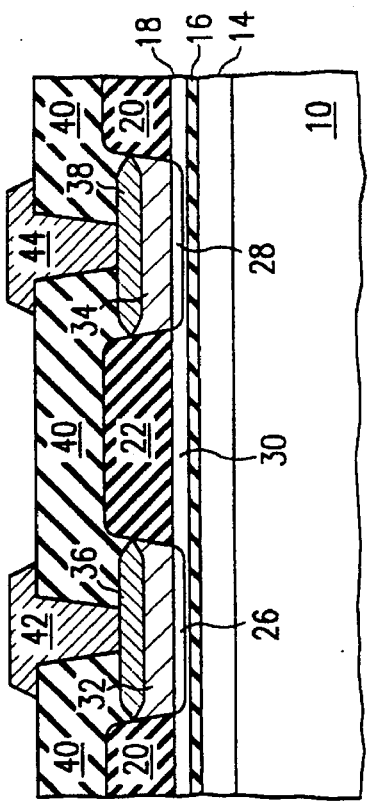
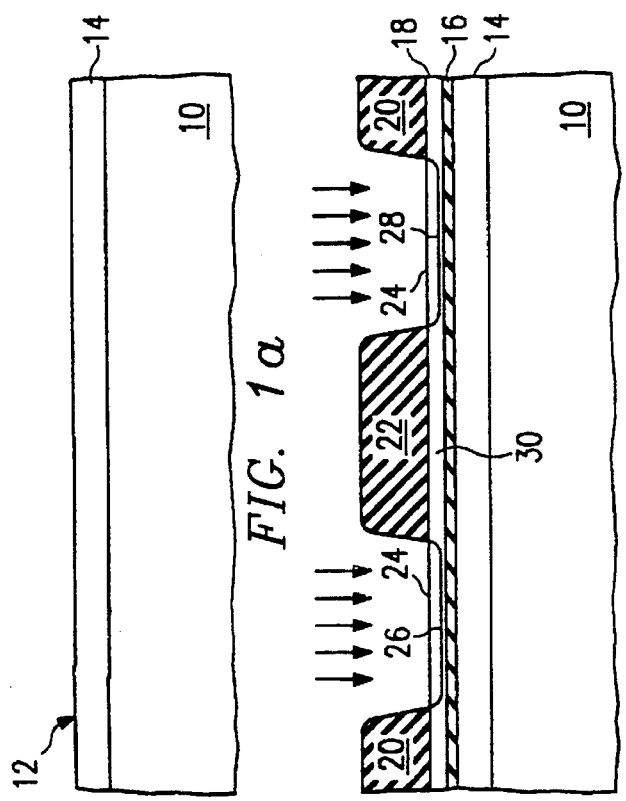
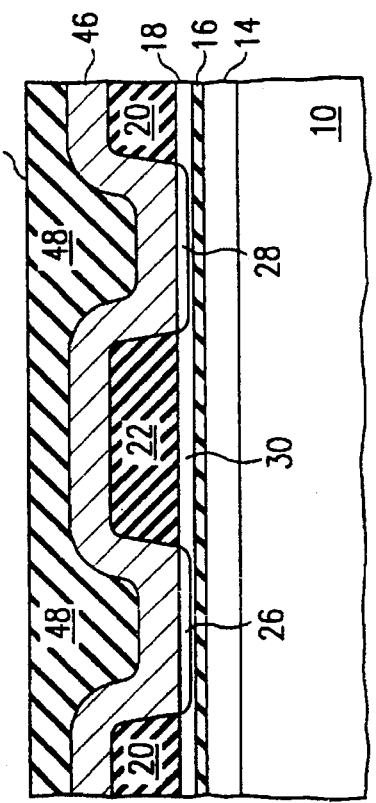
FIG. 1a  FIG. 1b  FIG. 1c  FIG. 1d  FIG. 1e  FIG. 2

METHOD FOR FORMING A FIELD-EFFECT TRANSISTOR INCLUDING A MASK BODY AND SOURCE/DRAIN CONTACTS

This application is a continuation of application Ser. No. 08/036,587, filed Mar. 24, 1993, (now abandoned), which is a divisional of 07/788,973 filed Nov. 7, 1991 (issued Jul. 27, 1993, as U.S. Pat. No. 5,231,296), which is a continuation of Ser. No. 07/618,015; filed Nov. 26, 1990 (now abandoned), which is a continuation of Ser. No. 07/452,854 filed Dec. 19, 1989 (now abandoned).

TECHNICAL FIELD OF THE INVENTION

This invention relates in general to the field of electronic devices and more specifically to a novel transistor and method for forming the same.

BACKGROUND OF THE INVENTION

The field effect transistor forms the building block of many modern digital integrated electronic devices. In order to increase the active device density of electronic devices, thin film transistors have been developed which provide adequate transfer characteristics but do not require the use of bulk single-crystal semiconductor material. A thin film field effect transistor may use polycrystalline, amorphous or partially recrystallized semiconductor material comprising its channel.

An important characteristic of a field effect transistor is the depth of the channel region. Accordingly, the depth of the layer of semiconductor material forming the channel of a thin film transistor is extremely shallow. Depending upon the operational characteristics required of the particular device, the channel region is typically on the order of 100 to 2000 angstroms in depth. Because of this shallow nature of the channel layer, contacting the channel layer at the source and drain regions is extremely difficult. An etching process is required to open windows to the source and drain regions in order to make these contacts. These etching processes can very easily etch completely through the channel layer because of its shallow nature dramatically affecting the operational characteristics of the transistor.

A further requirement of conventional field effect transistors is that the resistances associated with the contacts to the source and drain regions of the transistor must be appropriately controlled. A common method for reducing the contact resistance of the source and drain regions is the formation of a silicide layer on the source and drain regions. In the context of a thin film transfer, any attempt to form a silicide layer on the source and drain region of a channel layer of a thin film device would also erode the channel layer as the formation of a silicide layer necessarily consumes the semiconductor material on which it is formed.

Accordingly, a need has arisen for a thin film transistor architecture which provides for efficient contact to the source and drain regions of the channel layer. A further need has arisen for a thin film transistor architecture which allows for the formation of a silicide layer in contact with the source and drain regions in order to reduce the contact resistances associated with the transistor without eroding the thin film of material used to form the channel of the transistor.

SUMMARY OF THE INVENTION

In accordance with the present invention, a thin film transistor is provided which substantially eliminates or reduces disadvantages and problems associated with prior art thin film transistor architectures. More specifically, the present invention discloses a thin film transistor architecture which includes a channel layer having spaced apart source and drain regions. Conductive bodies are formed in contact with the source and drain regions of the channel layer to protect the source and drain regions. Electric contacts are then formed coupled to the conductive bodies.

An important technical advantage of the transistor of the present invention inheres in the fact that the conductive bodies provide points at which the source and drain regions of the transistor may be contacted while preventing erosion of the thin channel layer.

A further technical advantage of the transistor of the present invention is that the conductive bodies provide material from which a silicide layer may be formed. These silicided layers reduce the contact resistance and are formed consuming the material in the conductive bodies alleviating the risk of consuming the thin channel layer.

BRIEF DESCRIPTION OF THE DRAWINGS

A more complete understanding of the present invention may be acquired by referring to the detailed description and claims when considered in connection with the accompanied drawings in which like reference numbers indicate like features, and wherein:

FIGS. 1a through 1e are cross-sectional elevational diagrams which illustrate method of constructing the thin film transistor of the present invention; and FIG. 2 is a greatly enlarged cross-sectional elevational diagram which illustrates an intermediate step used in a particular embodiment of the present invention.

DETAILED DESCRIPTION OF THE INVENTION

Referring to FIGS. 1a through 1e, a process is illustrated for forming a thin film field effect transistor according to the teachings of the present invention. It should be understood that the thin film transistor of the present invention enjoys the important technical advantage of most thin film transistors in that it can be used in a variety of device contexts. Specifically, thin film transistors do not require the use of single crystalline semiconductor material and therefore can be formed essentially at any level of a complex three-dimensional semiconductor device. The process illustrated by FIGS. 1a through 1e is intended to illustrate a generic process shown solely for the purposes of teaching the present invention. For example, while the process illustrated in FIGS. 1a through 1e illustrate the formation of a transistor in close proximity to a substrate, the teachings of the present invention are equally applicable to the construction of a transistor in an intermediate or outer level of a stacked device configuration where no element of the transistor architecture is proximate to the substrate. It will be understood by those skilled in the art that the process illustrated in FIGS. 1a through 1e may be applied in a variety of contexts while still enjoying the important technical advantages of the transistor architecture of the present invention.

Referring to FIG. 1a, a semiconductor substrate 10 comprises an outer surface 12. A junction isolated gate conductor region 14 is formed in the outer surface 12 of semiconductor substrate 10. Gate conductor region 14 may be formed according to well known methods by the implantation of a sufficient number of ions to render the region 14 conductive. For example, if substrate 10 is a N type substrate, a sufficient implantation of boron ions will render region 14 conductive.

Conversely, if substrate 10 is a P type substrate, a sufficient implantation of phosphorous ions will render region 14 conductive.

The cross-section shown in FIG. 1a divides gate conductor region 14 in a longitudinal direction. Region 14 is intended to be used as a gate conductor to actuate the thin film transistor of the present invention and therefore, according to the embodiment illustrated in FIGS. 1a through 1e, should be an elongate region formed in substrate 10. It should be understood that the only requirement of gate conductor region 14 is that it must be proximate the channel region to be formed. A variety of other equivalent configurations could be used and the presentation of the present embodiment should not be construed to limit the scope of the present invention to only one embodiment. Further, although region 14 will be illustrated in FIGS. 1a through 1e as a buried structure, it will be understood by those skilled in the art that suitable electric contacts may be made along the length of the region 14 for the operation of the transistor of the present invention.

Referring to FIG. 1b, a gate insulator layer 16 is formed on outer surface 12 of gate conductor region 14 formed in semiconductor substrate 10. Gate insulator layer 16 may be grown or deposited according to well known methods to a depth on the order of 200 angstroms thick and may comprise, for example, an oxide material such as silicon dioxide. A channel layer 18 is then formed outwardly from gate insulator layer 16 by depositing a layer of semiconductor material on gate insulator layer 16. Channel layer 18 may comprise, for example, polycrystalline, amorphous, partially recrystallized or recrystallized semiconductor material. Channel layer 18 is used to form the channel of the thin film transistor of the present invention and may be on the order of 200 to 2,000 angstroms in thickness, depending on the required device characteristics of the particular transistor to be formed.

Referring to FIG. 1c, an insulator layer which may comprise, for example, an oxide material such as silicon dioxide, is deposited or grown, patterned and etched according to well known photolithographic methods to form field insulator layers 20 and mask body 22. Field insulator layers 20 may or may not be formed in an actual fabrication process. Only mask body 22 must be present according to the method of the present invention. At this point in the process, suitable ions may be implanted according to well known methods through an outer surface 24 of channel layer 18 to form doped source region 26 and doped drain region 28 in channel layer 18. Source region 26 and drain region 28 are formed adjacent mask body 22 such that they define between themselves a channel region 30 in channel layer 18. Channel region 30 is actuated and rendered conductive by a voltage being placed on gate conductor region 14 which functions as the gate of the thin film transistor of the present embodiment. It should be understood that the identification of source region 26 and drain region 28 as such are solely for convenience in the teaching of the present invention. Where appropriate, the transistor of the present invention may be constructed as an electrically symmetrical device allowing current flow in either direction.

Referring to FIG. 1c, several possible problems associated with prior art thin film transistors are readily apparent. Contacts must be made to source region 26 and drain region 28. Due to the extremely thin nature of channel layer 18, forming the contacts to regions 26 and 28 would be an extremely delicate process. The patterning and etching processes necessary to open contacts holes to source region 26 and drain region 28 could easily erode through regions 26 and 28. Further, in order to reduce the contact resistance at the source region 26 and drain region 28, silicide layers may be optionally formed on the outer surfaces of source and drain regions. However, due to the extremely thin nature of channel layer 18, any attempt to form a silicide layer on the source region 26 and drain region 28 could consume these regions during the process.

Referring to FIG. 1d, the solution to these problems according to the teaching of the present invention is illustrated. Conductive bodies 32 and 34 are formed outwardly from and in contact with source region 26 and drain region 28, respectively. Conductive bodies 32 and 34 are formed as shown in FIG. 1d between field insulator layer 20 and oxide mask body 22. Conductive bodies 32 and 34 may be formed of a variety of materials and may be formed by a variety of methods known in the art. For example, conductive bodies 32 and 34 may be formed by selective epitaxial growth of semiconductor material over source region 26 and drain region 28. The semiconductor material grown through this selective epitaxy process can be implanted with a suitable concentration of ions according to well known methods such that the epitaxial material is rendered electrically conductive. In the alternative, conductive bodies 32 and 34 may be formed by selective deposition of metal. Further, conductive bodies 32 and 34 may be formed of polycrystalline or amorphous semiconductor material which has been doped with a suitable concentration of impurities to be rendered conductive using a process which will be discussed in more detail with reference to FIG. 2. Additionally, the implantation process used to form source region 26 and drain region 28 may occur following the formation of conductive bodies 32 and 34.

Conductive bodies 32 and 34 provide the transistor architecture of the present invention several important technical advantages. First, conductive bodies 32 and 34 provide the necessary leeway for the process of contacting source and drain regions 26 and 28 of the transistor of the present invention as will be shown in FIG. 1e. Secondly, as shown in FIG. 1e, conductive bodies 32 and 34 provide material for the formation of silicide layers 36 and 38 which reduce or eliminate the problems associated with contact resistances for the transistor of the present invention if conductive bodies 32 and 34 comprise silicon. Silicide layers 36 and 38 may be formed in contact with conductive bodies 32 and 34 respectively comprising, for example, titanium disilicide according to well known self-aligned siliciding processes.

Referring to FIG. 1e, an isolation insulator layer 40 is conformally deposited covering the entirety of the transistor architecture of the present invention. Isolation insulator 40 may comprise, for example, conformally deposited silicon dioxide. The outer surface of isolation insulator layer 40 is then patterned and etched using well known photolithographic techniques to form openings exposing the outer surfaces of silicide layers 36 and 38. A source contact 42 and a drain contact 44 are then formed respectfully within each of these openings using known photolithographic techniques to provide an electrical contact to source region 26 and drain region 28, respectfully. Source contact 42 and drain contact 44 may comprise, for example, a suitable conductor such as aluminum, or polycrystalline or amorphous semiconductor material doped so as to be rendered conductive.

FIG. 2 is a greatly enlarged cross-sectional elevational diagram which illustrates a particular process step which may be used to form conductive bodies 32 and 34 in the method illustrated in FIGS. 1a through 1e. FIG. 2 illustrates a process step which occurs between FIG. 1c and FIG. 1d. Accordingly, following the optional implantation step discussed with reference to FIG. 1c used to form source region 26 and drain region 28, a layer 46 of polycrystalline or amorphous semiconductor material is conformally deposited over the entirety of the structure as shown in FIG. 2. Layer 46 may be in situ doped or may be doped after deposition such that it contains a suitable concentration of impurities such that it is rendered conductive. Following the conformal deposition of layer 46, a planar resist layer 48 is deposited such that an outer surface 50 of planar resist layer 48 is planarized. The resist layer 48 and the entire structure may be then placed in an etchant which is selective to oxide. This etching process anisotropically erodes the planar resist layer 50 and the portions of layer 46 disposed outwardly from field oxide layers 20 and oxide mask layer 22 until conductive bodies 32 and 34 remain as shown in FIG. 1d. Source region 26 and drain region 28 may then be implanted if these regions were not formed prior to the formation of conductive bodies 32 and 34.

As discussed previously, the process step illustrated by FIG. 2 comprises merely one method by which conductive bodies 32 and 34 might be formed. The discussion of selective epitaxial growth and selective metal deposition of conductive bodies 32 and 34 as well as the process illustrated by FIG. 2 should not be construed to limit the scope of the present invention to any particular method used to construct conductive bodies 32 and 34. A variety of other methods could be applied to form conductive bodies 32 and 34 depending upon the particular circumstances and device context. The present invention is not intended to be limited to any of these methods, but is solely limited by the scope and spirit of the appended claims.

Further, as discussed previously, the environment of the thin film transistor of the present invention illustrated in FIG. 1e is described solely for the purposes of teaching the present invention. It is an important technical advantage of thin film transistors that they may be applied in a variety of device contexts. The architecture described with reference to FIG. 1e comprises the constituent components of a thin film transistor of the present invention in merely one potential device context. For example, the device described with reference to FIG. 1e is a bottom-gated thin film device with the gate conductor 14 formed as a diffused region within a substrate 10. However, the teachings of the present invention are equally applicable to a thin film transistor architecture where the gate conductor is a conductive layer other than a diffused region within a substrate. This architecture could, for example, exist where the thin film transistor of the present invention is formed in a layer which is stacked outwardly from other active layers in an integrated device in order to capitalize on the technical advantage of thin film transistors in that they do not require the use of bulk single-crystal semiconductor material.

In operation, the field effect transistor illustrated in FIG. 1e is actuated by placing a voltage on gate conductor region 14. This voltage renders channel region 30 conductive and allows current to pass between source region 26 and drain region 28. A conduction path is thus formed from source contact 42 through silicide layer 36 into conductive body 32 through source region 26 through channel region 30 and drain region 28 through conductive body 34 and silicide layer 38 and exiting the device through drain contact 44.

Although the present invention has been described in detail with reference to the particular embodiment illustrated in the architecture of FIG. 1e, it should be understood that various changes, substitutions and alterations may be made hereto without departing from the spirit and scope of the invention as defined by the appended claims.

What is claimed is:

1. A method for constructing a transistor, comprising the steps of:

forming a gate conductor;

forming a channel layer insulatively disposed adjacent the gate conductor and including a channel region;

forming an insulative mask body over said channel layer so as to expose a first source/drain region and a second source/drain region, said insulative mask body being formed to a selected thickness;

doping said first source/drain region and said second source/drain region within the channel layer, and said first and second source/drain regions spaced apart so as to define the channel region, the gate conductor being operable to electrically actuate the channel region;

forming a first conductive body above and electrically coupled to the first source/drain region, said first conductive body having a thickness less than said selected thickness;

forming an insulating layer above said first conductive body; and forming a first electric contact within an opening in said insulating layer and above and electrically coupled to the first conductive body.

2. The method of claim 1 and further comprising the steps of:

forming a second conductive body adjacent and electrically coupled to the second source/drain region; and forming a second electric contact adjacent and electrically coupled to the second conductive body and through the insulating layer.

3. The method of claim 1 wherein said step of forming a gate conductor comprises the step of:

forming a conductive region in a semiconductor substrate by introducing impurities into a selected region of said semiconductor substrate, the channel layer formed outwardly from the substrate and the first conductive body formed outwardly from the channel layer.

4. The method of claim 1 and further comprising the step of:

forming a gate insulator layer operable to insulate the gate conductor from the channel layer.

5. The method of claim 4 wherein said step of forming a channel layer comprises the step of depositing a layer of semiconductor material on said gate insulator layer.

6. The method of claim 5 wherein said channel layer comprises a polycrystalline semiconductor material.

7. The method of claim 5 wherein said channel layer comprises an amorphous semiconductor material.

8. The method of claim 5 wherein said channel layer comprises a recrystallized semiconductor material.

9. The method of claim 1 wherein said step of forming a first source/drain region comprises the step of:

implanting a region of the channel layer adjacent the insulative mask body with impurities.

10. The method of claim 1 wherein said step of forming a first conductive body comprises the step of:

epitaxially growing semiconductor material to form the first conductive body on an exposed portion of the channel layer adjacent the insulative mask body.

11. The method of claim 1 wherein said step of forming a first conductive body comprises the steps of:

selectively depositing metal on an exposed portion of the channel layer adjacent the insulative mask body.

12. The method of claim 1 wherein said step of forming a first conductive body comprises the steps of:
   conformally depositing a layer of conductive material covering an outer surface of the insulative mask body and exposed portions of the channel layer adjacent the insulative mask body; and
   without patterning, etching the layer of conductive material to reexpose the outer surface of the insulative mask body and to form the first conductive body disposed adjacent the insulative mask body and outwardly from the channel layer.

13. The method of claim 12 wherein said step of conformally depositing comprises the step of conformally depositing and doping a layer of polycrystalline semiconductor material.

14. The method of claim 12 wherein said step of conformally depositing comprises the step of conformally depositing and doping a layer of amorphous semiconductor material.

15. The method of claim 12 wherein said step of conformally depositing comprises the step of conformally depositing a layer of metal.

16. The method of claim 11 and further comprising the step of forming a first insulating region adjacent said first conductive body wherein said first electric contact is formed through said first insulating region.

17. The method of claim 1 wherein said channel layer is on the order of 200 to 2,000 Angstroms thick.

18. The method of claim 1 wherein said insulative mask body comprises an oxide material.

19. The method of claim 18 wherein said step of forming an insulative mask body comprises the step of depositing an oxide material.

20. The method of claim 1 and further comprising the step of forming a silicide region on said first conductive body.

21. The method of claim 1 wherein said step of forming a first source/drain region and a second source/drain region within the channel region comprises forming a first source/drain region and a second source/drain region which are coplanar with said channel region.

22. A method for constructing a transistor, comprising the steps of:
   forming a gate conductor;
   forming a gate insulator outwardly from and adjacent the gate conductor;
   forming a channel layer outwardly from the gate insulator and insulated from the gate conductor by the gate insulator, the channel layer comprising a semiconductor material, a portion of said channel layer comprising a channel region;
   forming an insulative mask body of a selected thickness outwardly from said channel region;
   introducing impurities into first and second exposed regions of the channel layer adjacent opposite ends of the insulative mask body to form first and second source/drain regions spaced apart by said channel region;
   forming first and second conductive bodies adjacent and electrically coupled respectively to the first and second source/drain regions, said first and second conductive bodies being formed within the insulative mask body and having a thickness less than the selected thickness;
   forming an insulating layer overlying said first and second conductive bodies and said insulative mask body;
   forming a first contact hole within said insulating layer to expose at least a portion of said first conductive body and forming a second contact hole within said insulating layer to expose at least a portion of said second conductive body; and
   forming first and second electric contacts within the first and second contact holes and adjacent and electrically coupled respectively to the first and second conductive bodies.

23. The method of claim 22 wherein said step of forming first and second conductive bodies comprises the step of:
   selectively depositing first and second metal bodies adjacent and electrically coupled respectively to the first and second source/drain regions.

24. The method of claim 22 wherein said step of forming first and second conductive bodies comprises the step of:
   epitaxially growing a semiconductor material to form said first and second conductive bodies adjacent and electrically coupled respectively to the first and second source/drain regions.

25. The method of claim 22 wherein said step of forming first and second conductive bodies comprises the steps of:
   conformally depositing a layer of conductive material covering an outer surface of the insulative mask body and the first and second source/drain regions; and
   etching the layer of conductive material to reexpose the outer surface of the insulative mask body and to form the first and second conductive bodies adjacent and electrically coupled to respectively the first and second source/drain regions.

26. The method of claim 25 wherein said step of conformally depositing comprises the step of conformally depositing a layer of polycrystalline semiconductor material doped so as to be rendered conductive.

27. The method of claim 25 wherein said step of conformally depositing comprises the step of conformally depositing a layer of metal.

28. The method of claim 25 wherein said step of conformally depositing comprises the step of conformally depositing a layer of an amorphous semiconductor material doped so as to be rendered conductive.

29. A method for constructing a transistor, comprising the steps of:
   forming a gate conductor;
   forming a gate insulating layer over said gate conductor;
   depositing a layer of semiconductor material on said gate insulator layer to form a channel wherein said channel layer comprises a partially recrystallized semiconductor material;
   forming a first source/drain region and a second source/drain region within the channel layer and spaced apart so as to define the channel region between the first source/drain region and the second source/drain region, the gate conductor being operable to electrically actuate the channel region;
   forming a first conductive body above and electrically coupled to the first source/drain region; and.

30. A method of forming a transistor comprising the steps of:
   forming a gate conductor;
   forming a channel layer insulatively disposed above the gate conductor and including a channel region;
   forming a mask body over said channel layer, said mask body formed so as to expose a first region and a second region within said channel layer, wherein said first region and said second region are separated by said channel region;

doping said first region to form a first source/drain region and doping said second region to form a second source/drain region, said first and second source/drain regions self-aligned to said mask body;

conformally depositing a conductive layer and then, without patterning, etching the conductive layer to form a first conductive body over said first source/drain region and abutting said mask body and to form a second conductive body over said second source/drain region and abutting said mask body; and forming a first electrically conductive region adjacent and electrically coupled to the first conductive body.

31. The method of claim 30 wherein said first and second conductive bodies comprise a semiconductor material.

32. The method of claim 31 wherein said semiconductor material comprises silicon.

33. The method of claim 30 wherein said first electrically conductive material is formed from a refractory metal.

34. The method of claim 33 wherein said refractory metal and said silicon material are reacted to form a silicide region.

35. The method of claim 34 and further comprising the step of forming an electric contact abutting the silicide region.

* * * * *